United States Patent
Wadhwa et al.

(10) Patent No.: US 7,397,696 B1
(45) Date of Patent: Jul. 8, 2008

(54) CURRENT SENSING ARCHITECTURE FOR HIGH BITLINE VOLTAGE, RAIL TO RAIL OUTPUT SWING AND VCC NOISE CANCELLATION

(75) Inventors: Sameer Wadhwa, Santa Clara, CA (US); Michael Achter, Mountain View, CA (US); Bhimachar Venkatesh, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 387 days.

(21) Appl. No.: 11/023,914

(22) Filed: Dec. 28, 2004

(51) Int. Cl.
*G11C 11/34* (2006.01)
(52) U.S. Cl. .................. 365/180; 365/189.11
(58) Field of Classification Search .............. 365/180, 365/189.11
See application file for complete search history.

(56) References Cited

U.S. PATENT DOCUMENTS

| | | | | |
|---|---|---|---|---|
| 4,884,241 | A | * | 11/1989 | Tanaka et al. .......... 365/185.21 |
| 5,625,585 | A | * | 4/1997 | Ahn et al. ...................... 365/63 |
| 5,663,904 | A | * | 9/1997 | Arase ........................ 365/145 |
| 6,054,879 | A | | 4/2000 | Meng |
| 6,212,092 | B1 | * | 4/2001 | Shinozaki .................... 365/63 |
| 6,370,061 | B1 | * | 4/2002 | Yachareni et al. ...... 365/185.22 |
| 6,510,082 | B1 | | 1/2003 | Le et al. |
| 6,529,412 | B1 | * | 3/2003 | Chen et al. ............. 365/185.21 |
| 6,791,880 | B1 | * | 9/2004 | Kurihara et al. ........ 365/185.21 |
| 6,819,591 | B1 | | 11/2004 | Kurihara et al. |
| 2002/0176281 | A1 | * | 11/2002 | Tang ..................... 365/185.22 |

OTHER PUBLICATIONS

"Virtual-Ground Sensing Techniques for Fast, Low-Power, 1.8V Two-Bit-Per-Cell Flash Memories", Binh Quang Le, A Dissertation Submitted to the Department of Electrical Engineering and the Committee on graduate studies of Stanford University in partial fulfillment of the requirements for the degree of Doctor of Philosophy, Nov. 2003, 148 pgs.

* cited by examiner

*Primary Examiner*—Michael T Tran
(74) *Attorney, Agent, or Firm*—Eschweiler & Associates, LLC

(57) ABSTRACT

The present invention pertains to a circuit arrangement that, in one example, facilitates reading or determining an amount of current that flows through a memory cell when one or more voltages are applied to the cell. The amount of current resulting from the applied voltages is a function of the amount of charge stored within the cell, among other things, and the amount of stored charge represents information stored within the cell. As such, reading the resulting current allows data stored within the cell to be accessed and retrieved. It will be appreciated however, that use of the circuitry disclosed herein is not limited to memory applications. Rather, it can be used in any application where current sensing is required along with a regulated supply voltage.

22 Claims, 7 Drawing Sheets

CURRENT SENSING ARCHITECTURE FOR HIGH BITLINE VOLTAGE, RAIL TO RAIL OUTPUT SWING AND VCC NOISE CANCELLATION

FIELD OF INVENTION

The present invention relates generally to memory for electronic systems and the like, and in particular to a circuit architecture that facilitates sensing a current developed within a memory cell in response to one or more voltages applied to the cell.

BACKGROUND OF THE INVENTION

Many different types memory exist to store data for computers and the like. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to provide for data storage.

Each type of memory has its own particular advantages and disadvantages. For example, DRAM and SRAM allow individual bits of data to be erased one at a time, but such memory loses its data when power is removed. Alternatively, EEPROM can be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

As with other types of memory, flash memory is generally constructed of many memory cells that may store binary pieces of information referred to as bits. The respective memory cells are typically comprised of a semiconductor structure, such as a stacked gate metal oxide semiconductor (MOS) transistor device. The memory cells are generally organized into addressable units or groups, which are accessible for read, write and/or erase operations. The cells are, for example, commonly organized into bytes which comprise eight cells, and words which may include sixteen or more cells, usually configured in multiples of eight. The erase, write and/or read operations are commonly performed by application of appropriate voltages to certain terminals of the memory cells. In an erase or write operation, for example, the voltages are applied to cause charge to be removed or stored in a memory cell. In a read operation, on the other hand, appropriate voltages are applied so as to cause a current to flow in the cell, where the amount of current is a function of the amount of charge stored within the cell, among other things. The amount of charge stored within the cell corresponds to a state of the cell, and the state of the cell can be designated for data storage. For example, a certain amount of charge can correspond to a high data state which can be designated as a logic high or a binary data bit "1". Similarly, a lesser amount of stored charge can correspond to a low state which can be designated as a logic low or a binary data bit "0". A length of memory cells containing such respective binary bits can be strung together to store data, such as an 8 bit word, for example.

A relatively modern memory technology is dual sided ONO flash memory, which allows multiple bits to be stored in a single cell. In this technology, a memory cell is essentially split into two identical (dualed) parts, each of which is designed to store one of two independent bits. Each dual sided ONO flash memory cell, like a traditional cell, has a gate with a source and a drain. However, unlike a traditional stacked gate cell in which the source is always connected to an electrical source and the drain is always connected to an electrical drain, the source and drain of a dual sided ONO flash memory cells can be reversed depending upon which of the two bits/sides of the memory cell are operated upon.

As with arrays of other types of memory cells, dual sided ONO flash memory cells are fashioned by initially forming conductive bitlines within a semiconductor substrate. However, rather than merely forming an oxide layer over the bitlines in establishing the transistors that serve as the memory cells, a trilayer of oxide nitride oxide (ONO) materials is then formed over the bitlines and substrate in forming an array of ONO flash memory cells. This trilayer of material can be referred to as a "charge trapping dielectric layer", and generally includes a first insulating layer, a charge trapping layer, and a second insulating layer, where respective amounts of charge can be "trapped" within the charge trapping layer. Wordlines are then formed over the charge trapping dielectric layer substantially perpendicularly to the bitlines. Control over two bits per cell is governed by application of voltage signals to the wordline, which acts as a control gate, and changing bitline connections such that one bit is acted upon when the source and drain are connected in one arrangement and a complementary bit is acted upon when the source and drain are connected in another arrangement. A fixed ground line is generally not necessary in an array of ONO cells due to the differing bitline connections and resulting source and drain arrangements in the cells. As such, an array of ONO cells can be said to embody a "virtual ground" architecture.

A continuing trend in the electronics industry is to scale down electronic devices to produce smaller, yet more powerful devices (e.g., cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. The ability to "pack" more of these components onto a single semiconductor substrate, or a portion thereof (known as a die), also improves fabrication efficiency and yields. Accordingly, there are ongoing efforts to, among other things, increase the number of memory cells that can be fabricated onto an individual semiconductor wafer (or die).

One technique to pack more memory cells/transistors into a smaller area is to form their structures and component elements closer together. Forming bitlines closer together, for example, shortens the length of a channel defined there-between and allows more devices to be formed in the same area. This can, however, cause certain undesirable phenomena to become more prevalent. For example, isolating two bits or charges stored within a charge trapping layer becomes increasingly difficult as the channel length is decreased and the individual bits are brought closer together within the charge trapping layer. For example, the stored charges can contaminate or interfere with one another as they are brought closer together. This can, for example, cause a current developed in a memory cell during a read operation to seem inordinately high, which can lead to a mistaken interpretation of a logic high or "1" when, in fact, the read should have yielded a logic low or "0". The fact that stored charges or dual bits can impact one another is sometimes referred to complimentary bit disturb or CBD. Accordingly, it would be desirable to be able to ascertain a current developed in a memory cell, including a dual bit memory cell, with a high degree of accuracy to mitigate false or erroneous reads.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

According to one or more aspects of the present invention, a circuit for sensing a core current flowing through a bitline path and a memory cell in response to voltages applied to a gate of the cell and an acting drain of the cell is disclosed, where the magnitude of the core current is also a function of the amount of charge stored within the cell. In one example, the circuit includes a differential amplifier component operatively coupled to the bitline path and configured to provide a substantially constant desired voltage to a desired voltage node on the bitline path where the bitline path is operatively coupled to the acting drain of the cell. The circuit further includes a post processing circuit component operatively coupled to the bitline path and configured to receive an Rsense voltage that is a function of the core current and further configured to output an output voltage that is indicative of the core current, but is an amplification of the Rsense voltage.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
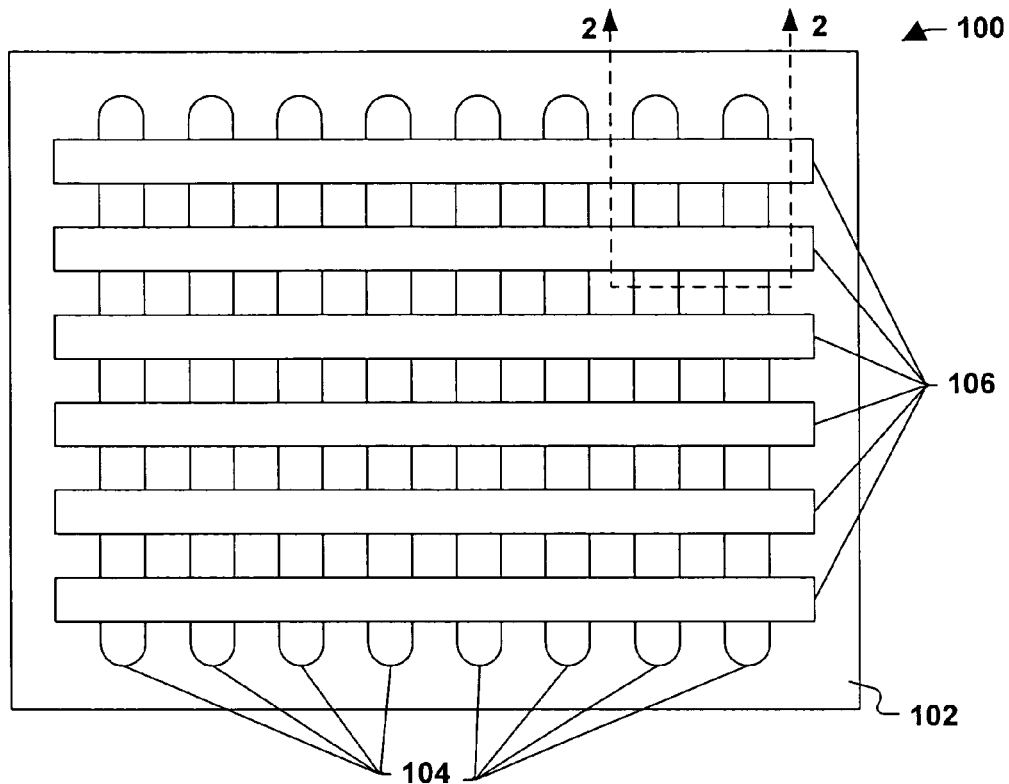
FIG. 1 is a top view of at least a portion of a memory array.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

The present invention pertains to a circuit arrangement that, in one example, facilitates reading or determining an amount of current that flows through a memory cell when one or more voltages are applied to the cell. The amount of current resulting from the applied voltages is a function of the amount of charge stored within the cell, among other things, and the amount of stored charge represents information stored within the cell. As such, reading the resulting current allows data stored within the cell to be accessed and retrieved. It will be appreciated however, that use of the circuitry disclosed herein is not limited to memory applications. Rather, it can be used in any application where current sensing is required along with a regulated supply voltage.

By way of example, prior art FIG. 1 represents a top view of at least a portion of a memory array 100. The memory array 100 is formed upon a semiconductor substrate 102, such as a semiconductor wafer, or die of the wafer. The array 100 includes a plurality of bitlines 104 that are implanted into the substrate 102, and that extend substantially parallel to one another. The array 100 further includes a plurality of wordlines 106 formed over the implanted bitlines 104 and substrate 102. The wordlines 106, in the present example, are substantially parallel to one another and are substantially perpendicular to the implanted bitlines 104.

Figure 2:
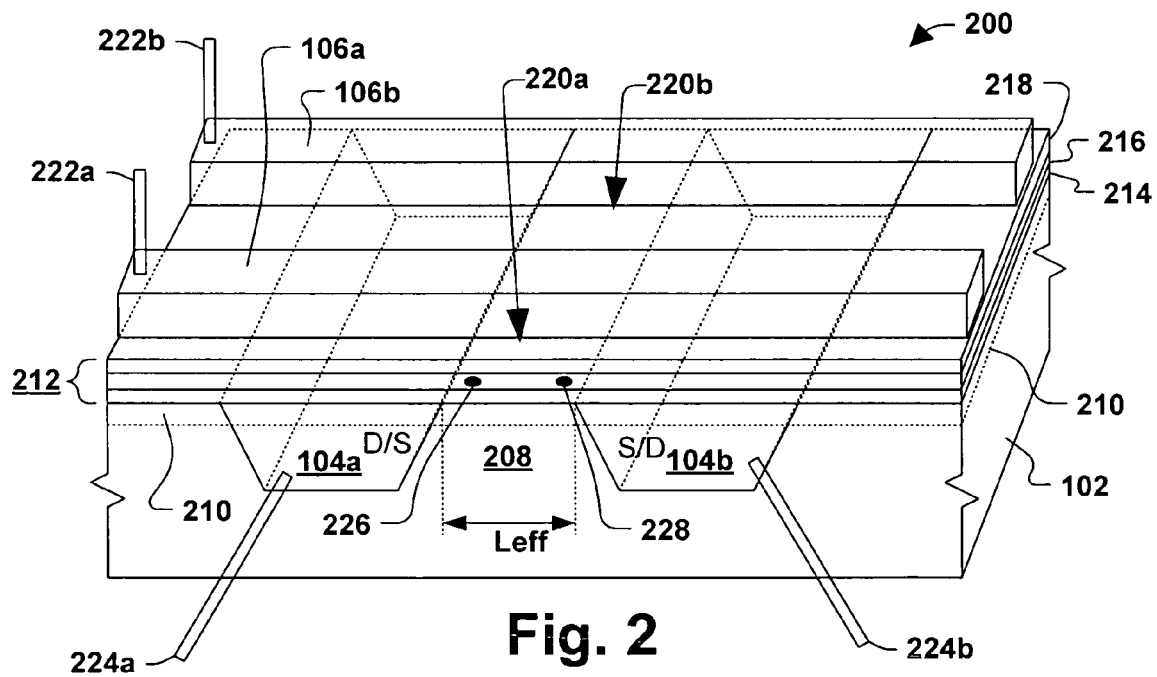
FIG. 2 is a cross-sectional isometric illustration of a portion of a memory array, such as that taken along line 2-2 of FIG. 1.

FIG. 2 is a cross-sectional isometric illustration of a portion 200 of a conventional memory array, such as that taken along line 2-2 of the array 100 in FIG. 1. It will be appreciated that, for purposes of discussion, a dual bit type of memory cell is depicted in the example illustrated in FIG. 2. However, it will also be appreciated that application of one or more aspects of the present invention is not limited to dual bit memory cells, nor to memory cells generally.

In the illustrated example, first and second conductive bitlines 104a and 104b are formed within a semiconductor substrate 102. It will be appreciated that any number of such bitlines can be implanted into the semiconductor substrate 102, and that such bitlines may correspond to the bitlines 104 depicted in FIG. 1. The bitlines are typically formed of an implanted n-type material, such as arsenic, for example. The first and second conductive bitlines 104a and 104b are spaced apart by an effective length (Leff) and a channel region 208 is defined between the bitlines 104a, 104b.

The substrate 102 in the illustrated example is doped with a p-type impurity such as boron, for example, to establish a threshold adjustment implant (Vtadjust) region 210 therein. The threshold adjustment implant provides a region 210 that is more heavily doped than the semiconductor substrate 102. The Vtadjust region 210 helps to set a threshold voltage Vt of the transistor devices at which a current can be conducted in a transistor based memory cell defined within/upon the substrate 102. By way of example, the substrate 102 can be formed out of silicon and can itself be doped with a p-type impurity.

A charge trapping dielectric layer 212 is formed over the semiconductor substrate 102 and implanted bitlines 104a, 104b. The charge trapping dielectric layer 212 is generally composed of three separate layers: a first insulating layer 214, a charge trapping layer 216, and a second insulating layer 218. The first and second insulating layers 214 and 218 are typically formed of an oxide dielectric such as silicon dioxide ($SiO_2$) and the charge trapping layer 216 is generally formed of a nitride dielectric such as silicon nitride ($Si_xN_y$). The oxide-nitride-oxide configuration is commonly referred to as an ONO layer for convenience.

Electrically conductive wordlines 106a, 106b overlie the charge trapping dielectric layer 212. It will be appreciated that any number of such wordlines can be formed over the charge trapping dielectric layer 212, and that such wordlines may correspond to the wordlines 106 depicted in FIG. 1. The wordlines can be formed out of a polysilicon material, for example, where the polysilicon material may be deposited over the charge trapping dielectric layer 212 and then patterned and etched into the shape of the wordlines.

It will be appreciated that a transistor that serves as a memory cell 220a is thus defined by a portion of the bitline 106a that overlies the channel region 208, a portion of the charge trapping dielectric layer 212 that similarly overlies the channel region 208, the portion of the substrate 102 making up the channel region 208 and respective portions of the bitlines 104a, 104b that are adjacent to the channel region 208. It will also be appreciated that another transistor based memory cell 220b would be similarly established behind cell 220a, and that other similar cells would be defined to the left and to the right of cells 220a and 220b to make up an array of such cells. Although not shown, it can be appreciated that adjacent cells share bitlines in this architecture.

As in all such transistor based memory cells, the wordline 106a serves as a gate for cell 220a, and allows a gate voltage to be applied to the gate of the cell 220a, such as by way of an electrical contact 222a operatively coupled to the wordline 106a. Similarly, a gate voltage can be applied to the gate of cell 220b by way of an electrical contact 222b operatively coupled to wordline 106b. It will be appreciated that since wordlines are continuous, a gate voltage is generally applied concurrently to respective gates of memory cells that are in the same row, such as respective cells (not shown) that would be to the left and to the right of cells 220a and 220b, for example.

Portions of the bitlines 104a, 104b adjacent to the channel region 208 serve as source and drain regions of the transistor based memory cell 220a. As with the wordlines, a voltage can be applied to these regions by way of electrical contacts 224a and 224b, for example. Additionally, since the bitlines 104a, 104b are continuous, a bias applied thereto generally reaches all of the memory cells on the same bitlines (notwithstanding losses due to resistance, etc.). Since, in the illustrated example, a dual bit memory cell is depicted, either of the bitlines can serve as the source (S) or the drain (D) of the transistor 220a depending upon which side of the transistor is being operated upon, hence the aforementioned virtual ground architecture. Locations 226 and 228 generally indicate where respective amounts of charge can be stored in the charge trapping layer 216 of the memory cell 220a to represent respective states of two separate bits of data.

It will be appreciated, however, that the different charges stored in the charge trapping layer 216 will be brought closer together as scaling occurs and the channel length shrinks, for example. This may give rise to complimentary bit disturb (CBD), the effects of which may be particularly noticeable when reading data from the memory cell. For example, to read data from the cell 220a a gate voltage is applied to the gate of the cell, such as via contact 222a, while a supply voltage ($V_{cc}$) is concurrently applied to one of the two bitlines 104a or 104b, such as via contact 224a or 224b. The particular bitline 104a or 104b that receives the supply voltage depends upon which of the bitlines is serving as the drain of the cell 220a, which is, in turn, a function of which side of the cell is being read. The application of these voltages causes a current to flow within the cell, generally through the channel 208—from the drain to the source, where the magnitude of the current is a function of the amount of charge stored in the side of the cell 220a being read. With CBD, however, the current read out of the cell may appear larger or smaller than it would normally be in the absence of the neighboring charge. Accordingly, the current read out may mistakenly be interpreted to correspond to a data bit of "1" instead of "0" and vice versa. Thus, it would be desirable to be able to increase the resolution of current read out from a transistor based memory cell so that a more accurate determination of cell state/bit level can be made. As will be discussed further, increasing the bitline voltage level during the read operation is one technique for mitigating CBD and facilitating more accurate reads.

Additionally, to meet the ever growing demand for greater storage capacity in increasingly smaller electronic devices, dual bit memory cells, such as cell 220a are being engineered to store multiple levels of charge on both sides of the charge trapping layer 216. This is possible because the charge trapping layer 216 is substantially non-conductive and, thus, a charge instilled therein (e.g., via application of an appropriate wordline voltage) remains substantially localized at positions 226 and 228. This allows the memory cell 220a, and correspondingly an array of such cells, to store an increased amount of data. For example, if four different levels of charge (e.g., 1, 2, 3 and 4) can be stored on both sides of the cell 220a at locations 226 and 228, then the cell 220a can represent 16 different combinations of bit states (e.g., 1-1, 1-2, 1-3, 1-4, 2-1, 2-2, 2-3, 2-4, 3-1, 3-2, 3-3, 3-4, 4-1, 4-2, 4-3 and 4-4). It can be appreciated, however, that this reduces read margins for reading the different bit levels and exacerbates the difficulty in correctly identifying the different bit states.

Figure 3:
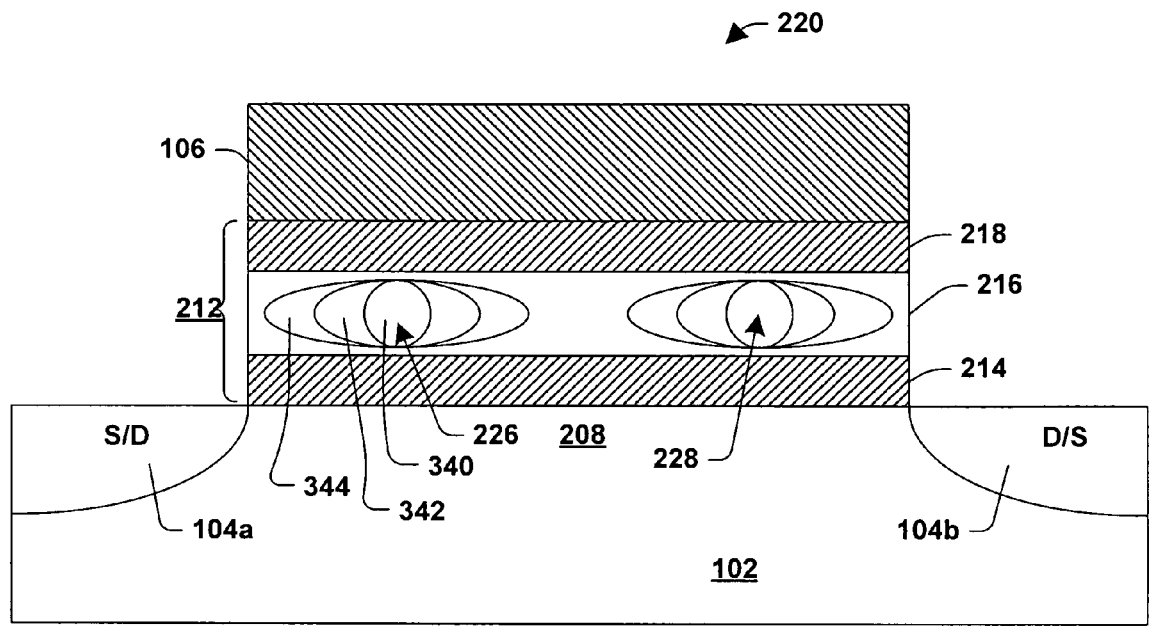
FIG. 3 is a cross sectional illustration of a dual bit memory cell.

FIG. 3 is a cross sectional illustration of a dual sided ONO flash memory cell 220 illustrating the capability of the cell to store varying degrees of charge at locations 226, 228. It will be appreciated that the memory cell 220 may, for example, correspond to the memory cell 220a depicted in FIG. 2. The cell 220 includes a charge trapping dielectric layer 212 that comprises a charge trapping layer 216 sandwiched between two dielectric layers 214, 218. The charge trapping layer 216 is formed from one or more substantially non-conductive substances, such as nitride based materials. The dielectric layers 214, 218 are similarly formed from one or more electrically insulating substances, such as oxide based materials. The layer to layer arrangement of the charge trapping dielectric layer 212 is commonly referred to as an ONO layer.

The charge trapping layer dielectric layer 212 is formed over a substrate 102 that may be formed from silicon or some other semiconductor material, for example. The substrate 102 may be selectively doped with a p-type dopant, such as boron, for example, to alter its electrical properties. In the example illustrated, the substrate 102 has buried bitlines or bitline diffusions including a first bitline 104a and a second bitline 104b. The bitlines 104a and 104b may, for example, be formed by an implanted n-type dopant. A channel 208 is defined within the substrate between the first 104a and second 104b bitline diffusions.

Overlying the upper dielectric layer 218 of the charge trapping dielectric layer 212 is a gate 106 (e.g., a portion of a wordline). This gate 106 may be formed from a polysilicon material, for example, and may be doped with an n-type impurity (e.g., phosphorus) to alter its electrical behavior. The gate 106 serves as a means for allowing a voltage to be applied to the cell 220 such that respective charges can be stored within and read out and erased from the cell at locations 226, 228, depending upon the electrical connections of the bitline diffusions 104a, 104b as source and drain.

The dual sided ONO flash memory cell 220 is generally symmetrical, thus the bitlines 104a and 104b are interchangeable as acting source and drain. The cell 220 can be programmed by applying a voltage across the gate 106 and an acting drain region and connecting an acting source region to ground. It can be appreciated that if the voltages utilized to program the left 226 and right 228 bit locations of the cell 220 are increased or sustained for longer periods of time, the number of electrons or amount of charge stored at these locations can be increased or otherwise varied. This allows the cell 220 to be utilized for additional data storage. For example, different amounts of charge can correspond to different programmed states. In the example illustrated, for instance, both the left 226 and right 228 bit locations can be said to have four different states or levels, namely 1, 2, 3 and 4, where level 1 corresponds to a situation where the locations are blank or un-programmed, and levels 2, 3 and 4 correspond to increasing amounts of stored charge, respectively. With regard to the left bit location 226, for example, a level 2 may correspond to a relatively small amount of stored charge 340, while levels 3 and 4 may correspond to increasingly larger amounts of stored charge 342 and 344, respectively.

It can be appreciated that the quantity of charge stored in the respective locations 226 and 228 influences the amount of current that flows between the acting source and the acting drain during a read operation, as well as the level of a threshold voltage (Vt) that must be applied to the gate 106 in order to cause such current to flow. Thus, the level of stored bits can be determined by examining drain to source currents (sometimes referred to as the core current Icore) as well as corresponding applied threshold gate (wordline) voltages. For example, measured currents and/or threshold voltages that fall within first, second, third or fourth ranges may, for example, be indicative of a level 1, level 2, level 3 or level 4, respectively for a particular bit.

It can be further appreciated, however, that even though the charge trapping layer 216 is substantially non-conductive and electrons trapped therein remain substantially localized within regions 226 or 228, the effects of complimentary bit disturb can manifest to a greater degree where dual bits can be programmed to different levels, such as 340, 342 and 344. For example, if left bit location 226 is un-programmed (level 1) or is only slightly programmed (level 2) and right bit location 228 is highly programmed (level 4), then some of the charge utilized to program the right bit may influence the left bit, and cause current flowing in the cell during a left bit read to be higher than intended, for example. This can similarly cause the threshold voltage necessary to read the left bit to be inflated such that its Vt is more indicative of a level 3 rather than the actual level 1 or level 2 of the left bit. Similarly, the (lack of) charge on the left bit may cause the right bit to read a lower current than intended, or rather cause the threshold voltage necessary to read the right bit to be deflated such that this Vt is more indicative of a lower bit level.

Figure 4:
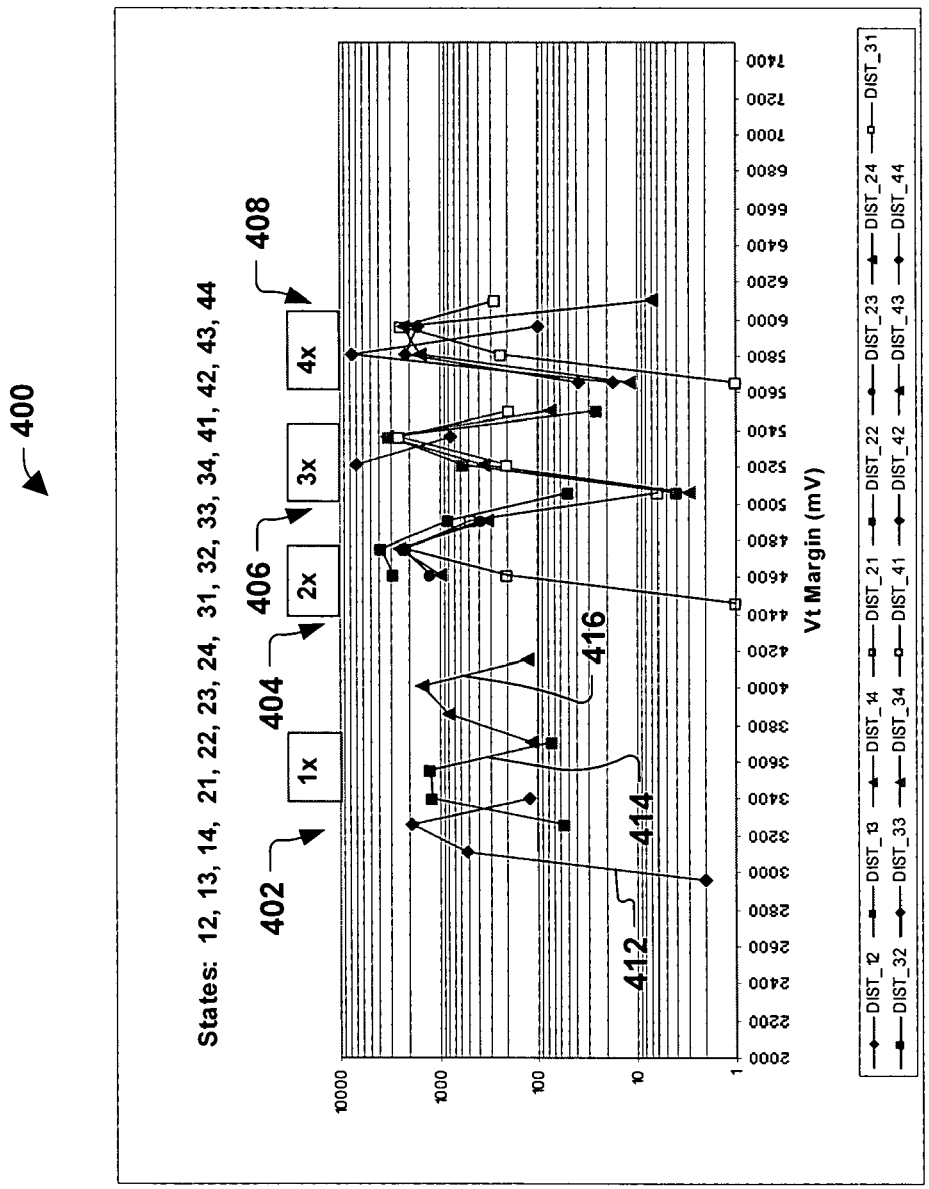
FIG. 4 is a graph illustrating a situation where dual bits can be programmed to four different levels.

FIG. 4 is a graph 400 that illustrates such a situation where dual bits within a cell can be programmed to four different levels, and where the charges on the cells can affect one another. A threshold read voltage (Vt) margin for one of the bits as measured in milli-volts (mV) is plotted on the x-axis, while the distribution or number of occurrences for particular Vt's is plotted on the y-axis on a logarithmic scale. The graph 400 includes four different exemplary groupings of curves 402, 404, 406, 408 corresponding to the four different levels the bit can possess. Each of the groupings contains a plurality of curves that reveal the shift in read Vt for the measured bit as the level of the neighboring or complimentary bit is altered (e.g., increased).

For example, grouping 402 includes three curves 412, 414, 416 that correspond to states of 1-2, 1-3 and 1-4, respectively. It can be seen that as the neighboring bit is programmed harder, a range of values of Vt for the read bit (which remains at a level 1 in all of the curves 412, 414, 416 in grouping 402) increases. In curve 412, for example, where the complimentary bit is programmed to a level 2, the value of Vt for the read bit falls within a range of between about 3000 to about 3500 millivolts. In curve 416, however, where the complimentary bit is programmed to level 4, the range of Vt values for the read bit is shifted upwards to between about 3700 to about 4200 millivolts. It can be appreciated that, while not as dramatic, similar shifts occur where the read bit is programmed to levels 2, 3, and 4 and the neighboring bit is cycled through programmed levels 1, 2, 3, and 4. This can be seen in groupings 404, 406 and 408, respectively.

Figure 5:
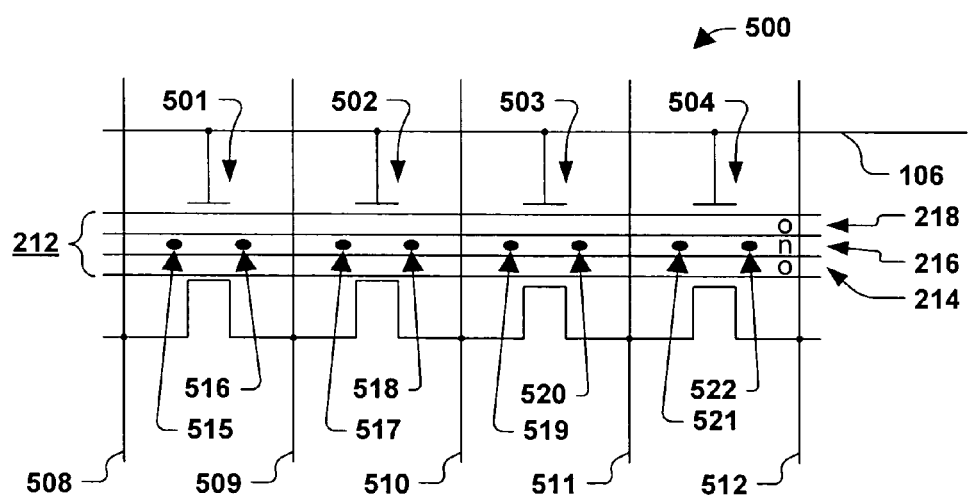
FIG. 5 is a schematic illustration of a portion of a memory core, such as may include at least part of the array depicted in FIG. 1.

FIG. 5 schematically illustrates a portion 500 of a memory core such as may include at least part of the array 100 depicted in FIG. 1. The circuit schematic shows a line or row of memory cells, which includes memory cells 501 through 504, any one of which may correspond to memory cell 220 depicted in FIG. 3 and/or 220a of FIG. 2, for example. The respective memory cells 501 through 504 are connected in a virtual ground type implementation such that pairs of the memory cells share a common bitline. For instance, in the example shown, the memory cell 501 has associated bitlines 508 and 509; the memory cell 502 has associated bitlines 509 and 510; the memory cell 503 has associated bitlines 510 and 511; and the memory cell 504 has associated bitlines 511 and 512. As such, cells 501 and 502 share bitline 509, cells 502 and 503 share bitline 510 and cells 503 and 504 share bitline 511, respectively. Additionally, the memory cells are coupled to a common wordline 106, which serves as a control gate for the cells.

The memory cells in the illustrated example are dual bit cells such that, depending upon wordline voltages and bitline connections, the memory cells 501 through 504 are capable of writing, reading, and erasing bits at locations 515 through 522. Storage of multiple bits is made possible, at least in part, by a charge trapping dielectric layer 212 interposed between the bitlines and the wordline. The charge trapping dielectric layer 212 includes multiple insulating layers 214, 218 (e.g., of oxide based material) that sandwich a charge trapping layer 216 (e.g., of nitride based material). To perform a read operation at location 515, for example, the source is designated so as to be connected to bitline 508 and the drain is designated so as to be connected to bitline 509, and a supply voltage is applied to bitline 508 and a gate voltage is applied to the wordline 106. During a programming operation at location 515, for example, the source and drain are reversed such that the source is designated so as to be connected to bitline 509 while the drain is designated so as to be connected to bitline 508. By way of further example, to read at location 516 the drain is connected to bitline 508 and the source is connected to bitline 509.

The charge trapping or ONO layer 216 allows the different bits to be stored at multiple states or levels as well. For example, depending upon the voltage applied to the memory cells 501 through 504 by the control gate or wordline 106 during programming, varying amounts of charge can be stored at locations 515 through 522. The different amounts of charge may correspond to different bit states or levels, for example. If four different charge levels (e.g., 1, 5, 3 and 4) can be stored at each of the bit locations 515 through 522, for example, then each two-bit cell 501 through 504 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

One or more aspects of the present invention facilitate a more accurate determination of bit levels by providing a higher regulated bitline voltage level during a read operation while increasing the current sensitivity. In conventional current sensing circuits, for example, an output is derived from the same voltage branch which generates the bitline voltage supply. Therefore, attempts to increase bitline voltage result in a reduced output voltage swing (across a given current range) and thus a reduced current sensitivity. According to the teachings herein, the final output swing is generated in a separate branch—thus allowing a higher bitline voltage level (i.e., mitigated CBD) while also providing for increased current sensitivity (e.g., by increasing the output swing). One or more aspects of the present invention use a metric known as transconductance (Gm) to determine the bit level. More particularly, raising the bitline level in accordance with one or more aspects of the present invention makes the memory cell operate closer to its saturation region of operation. In this region, the memory cell transconductance is much higher than when it is operating in its linear region (when the bitline voltage is lower). A higher tranconductance results in a larger current margin for a given Vt differential between the reference and core memory cells. Thus, raising the bitline results in an improved read margins.

Figure 6:
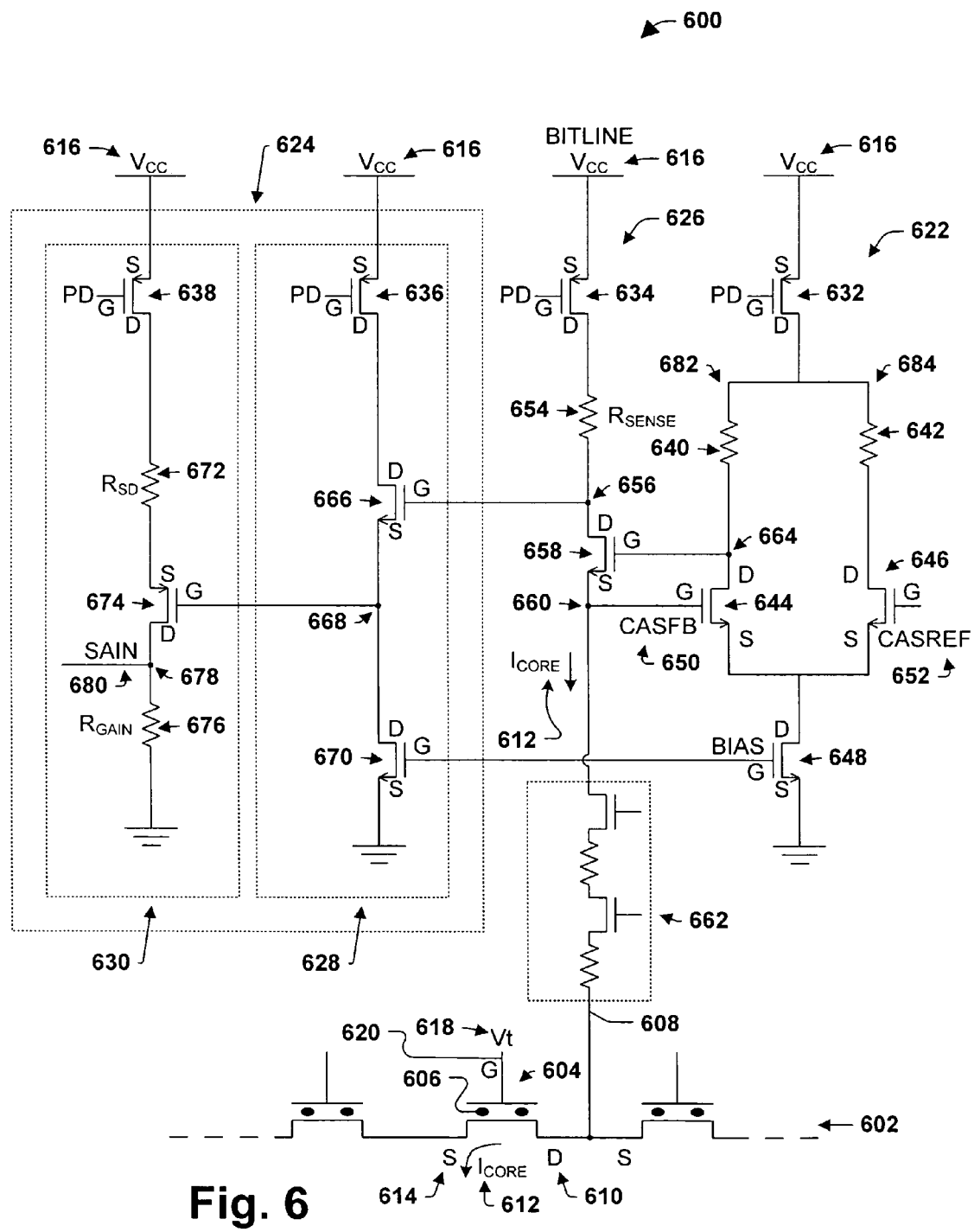
FIG. 6 is schematic diagram of a circuit according to one or more aspects of the present invention that facilitates current sensing.

FIG. 6 is a schematic diagram illustrating a circuit arrangement 600 according to one or more aspects of the present invention that facilitates sensing a current (e.g., I core) with a higher degree of resolution. While not intending to be limited to the example presented, the circuit 600 is described in the context of sensing current in a transistor based memory cell, such as a dual bit flash memory cell. Accordingly, the circuit 600 is operatively connected to a row or chain 602 of such dual bit memory cells. In the illustrated example, the circuit 600 is operatively connected to a particular cell 604 within the row 602 so as to be able to determine the current flowing through the cell 604 when particular voltages are applied to the cell 604. For purposes of discussion, the left side of the dual bit cell 604 is being read (e.g., from location 606) in the illustrated example such that a bitline 608 coupled to the cell 604 corresponds to an acting drain 610 of the cell 604. Accordingly, a current (Icore) 612 that flows through the cell 604 when adequate voltages are applied to the cell flows from the drain 610 to the source 614 of the cell 604 when a regulated voltage (close to CASREF) 616 is applied to the bitline 608 and a sufficient gate voltage Vg 618—at times referred to as a threshold voltage Vt—is applied to the gate 620 of the cell 604 (e.g., via a wordline that functions as gates for respective cells in the row 602).

The circuit includes a differential amplifier component 622 and a post processing circuit component 624, both of which are operatively coupled to a bitline path 626. The post processing circuit component 624 further includes a level shifter/source follower component 628 and a common source gain stage component 630 that essentially functions as an amplifier. The differential amplifier component 622, bitline 626, level shifter component 628 and common source gain stage component 630 are operatively coupled to supply voltage Vcc 616. Similarly, differential amplifier component 622, bitline 626, level shifter component 628 and common source gain stage component 630 include, in the present example, respective power down (PD) p type or PMOS transistors 632, 634, 636, 638 operatively coupled to the supply voltage 616, with the respective sources (S) of the PD's toward the supply voltage 616. It will be appreciated that when a PD signal is high, the respective transistors 632, 634, 636, 638 are off, rendering the circuit 600 deactivated.

The differential amplifier 622 includes first 640 and second 642 resistors in parallel with one another and in series with the drains (D) of respective first 644 and second 646 n type or NMOS transistors. The sources (S) of transistors 644 and 646 are connected to the drain of a bias NMOS transistor 648, the source of which is coupled to ground. The gates (G) of transistors 644, 646 are connected to voltage levels CASFB 650 and CASREF 652, respectively.

The drain of power down transistor 634 in bitline 608 is coupled to one end of a sense resistor Rsense 654, with the other end of the sense resistor 654 going to a node 656 that is coupled to the drain (D) of a bitline NMOS transistor 658 in the bitline path 626. The source (S) of the bitline path NMOS 658 is coupled to a node 660 that connects down to drain (D) 610 of the memory cell 604. Miscellaneous elements 662 (e.g., resistors, transistors, etc.) are illustrated as being in the bitline path 626 between the node 660 and the drain (D) 610 of the memory cell 604 to represent parasitic behavior that occurs within the bitline path 626 and help illustrate that a parasitic voltage drops occur between the supply voltage Vcc and the drain terminal 610 of the cell 604 during a read. The gate (G) of the bitline path transistor 658 is coupled to a node 664 within the differential amplifier 622 situated between the first resistor 640 and the first transistor 644 of the differential amplifier 622. Similarly, the gate (G) of the first transistor 644 is coupled to node 660 in the bitline path 626.

The drain (D) of power down transistor 636 of level shifter component 628 is coupled to the drain (D) of an n type or NMOS source follower transistor 666, with the source (S) of transistor 666 coupled to a node 668 that leads to the drain (D) of a secondary NMOS transistor 670 in the level shifter component 628. The gate (G) of the source follower transistor 666 is coupled back to node 656, and the gate (G) of the second transistor 670 is coupled to the gate (G) of transistor 648 and a bias voltage. The source (S) of second transistor 670 is coupled to ground.

The drain (D) of power down transistor 638 of common source gain stage component 630 is coupled to one end of a source degeneration resistor Rsd 672, and the other end of the resistor 672 is coupled to the source (S) of a p type or PMOS gain transistor 674. By way of example, Rsd 672 can have a value of between about 1000 to about 4000 ohms. The gate (G) of gain transistor 674 is coupled back to node 668 and the drain (D) of transistor 674 is coupled to one end of a gain resistor Rgain 676, the other end of which is connected to ground. By way of example, Rgain 676 can have a value of between about 15000 to about 30000 ohms. The output of the circuit 600 can be tapped off of at node 678 situated between the drain (D) of gain transistor 674 and the first end of the gain resistor 676. The output of the circuit is a function of the current 612 (Icore) flowing in the bitline 608 and through the memory cell 604. This core current 612 is itself a function of the amount of charge stored in the memory cell 604, and more particularly in the right half of the cell—in the illustrated example—at location 606, as well as the voltages applied to the drain (D) 610 and gate (G) 620 of the cell 600. The output of the circuit 600 can be used as an input to a sense amplifier (SAIN) 680 which can utilize the same in making a determination as to the level of the charge stored at location 606.

With regard to the operation of the circuit 600, the differential amplifier 622 serves to provide a desired voltage at node 660—referred to as desired voltage node—which is at reference level CASFB 650. In particular, the voltage of CASFB 650 (node 660) is modulated to so as to be maintained at or near the desired voltage level of CASREF 652. It is undesirable for CASFB to float because Icore 612 is a function of CASFB drain 610 to source 614 voltage, where the voltage at drain 610 is generally CASFB (notwithstanding the bitline path parasitics 662). Thus, the reference voltage of CASREF 652 is generated and CASFB 650 is regulated with the differential amplifier 622 so as to be maintained at or about CASREF, which is desirably maintained near the supply voltage Vcc 616 to reduce CBD and thus produce greater read margins. As will be discussed below, conventionally a bitline voltage at or near Vcc is not attainable due to large (sense) resistor values.

With particular regard to the differential amplifier 622, for example, a current is driven down through first 682 and second 684 branches of the amplifier 622 such that the same voltage drop is seen across both the left 682 and right 684 sides of the amplifier 622. The differential amplifier 622 maintains its balance such that if a voltage drop across the left resistor 640 is greater than a drop across the right resistor 642, then the voltage across the left transistor 644 and thus at node 664 is brought up relative to a drop across the right transistor 646 so that the entire drop across the left branch 682 is the same as the total drop across the right branch 684. Increasing the voltage at node 664 increases' the voltage at the gate of the bitline path n device 658 which causes this transistor 658 to "turn on" harder which makes it appear as more of a short. The "shorted" bitline path n device 658 has less of a voltage drop across it and CASFB 650 is thus pulled up closer to Vcc 616.

If, on the other hand, a voltage drop across the right resistor 642 is greater than a voltage drop across the left resistor 644, then the voltage at node 664 is dropped down even further to even out the total voltage drop across the left 682 and right 684 branches. Reducing the voltage at node 664 also drops the voltage at the gate of transistor 658 which causes it to "turn off" or be on to a lesser degree which in turn makes it appear as more of an open. This transistor 658 is thus more resistive and has a greater voltage drop across it as core current 612 flows there-through and CASFB 650 is pulled down to Vcc minus the drop across the bitline path n device 658. It will be appreciated that the bitline path n device 658 is continually modulated so that the ensuing voltage at CASFB 650 is maintained at the desired value of CASREF 652. The differential amplifier 622 essentially acts as a current mirror such that CASFB 650 is substantially equal to CASREF 652, where the drop across the left 644 and right 646 transistors corresponds to CASFB 650 and CASREF 652, respectively.

In the bitline path 626, it can be appreciated that the voltage at node 656 (sometimes referred to as Rsense voltage) is equal to the current 612 in the bitline path times the value of the sense resistor 654, and that this voltage value thus changes as the core current 612 (Icore) changes. Very little voltage drop is seen across the PD devices 632, 634, 636, 638 (e.g., on the order of between about 1 to about 5 millivolts). As such, the power down devices are generally ignored as they effectively pass Vcc onto the node below them. Similarly, the value of Rsense 654 is desirably kept very low (e.g., on the order of between about 3000 to about 5000 ohms) so that that the Rsense voltage at 656 is small (e.g., on the order of between about 50 millivolts to about 150 millivolts). This allows CASFB 650 to go as high as possible (e.g., nearly to Vcc) which can reduce CBD and promote a wider read margin for determining bit levels. A small Rsense value was heretofore not possible due to its impact on output voltage swing.

Maintaining the value of Rsense 654 low, however, also keeps the output swing at node 656 relatively small, which may not be practicable for differentiating between different bit levels and obtaining accurate and reliable reads. One or more aspects of the present invention allow a very small Rsense to be maintained, however, because even though the swing at node 656 is small, the swing is recovered at a later stage. More particularly, the output at node 656 is applied to the gate of the source follower transistor 666 of the level shifter component 628, where this voltage is level shifted (by a fixed amount) and applied to node 668 via the source of transistor 666 (hence the name "source follower" since the signal at the source follows that of the gate). It will be appreciated that transistor 670 act, at least in part, as a resistive element to facilitated the operation of the source follower transistor 666.

The output of the level shifter component 628 is applied to the common source gain stage component 630, which multiplies its input by a gain factor. More particularly, the output from node 668 is received at the gate at the gain transistor 674 and is multiplied by the gain factor to yield a substantially rail to rail swing from between about 0 to about Vcc on node 678 or SAIN 680. The gain factor of the common source gain stage component 630 is equal to the transconductance (Gm) of transistor 674 times the value of resistor Rgain 676. The output of stage 630 can be said to be an amplification of the Rsense voltage. It will be appreciated that component 630 is referred to as a common source gain stage, rather than a common drain gain stage or a common gate gain stage, because the source of transistor 674 is connected to the supply voltage Vcc 616, rather than its drain or gate.

When the voltage at the gate of transistor 674 changes (e.g., due to changes in the core current 612 and resulting changes at nodes 656 and 668), the gate to source voltage across gain transistor 674 is shifted by the same amount. When this gate to source voltage is shifted, the current through the source of the transistor 674 changes as well, and if the transistor operates in saturation, the current through the device 674 is proportional to the gate to source voltage minus the square of the threshold voltage of the device or $(Vgs-Vt)^2$. The voltage at node 678 or at SAIN 680 is equal to the drain current times the value of Rgain 676. Accordingly, a swing "felt" at the gate of the gain transistor 674 is amplified in the current through the transistor 674, and particularly the drain current of the gain transistor 674. More particularly, the gain in the current is a function of the square of the change at the gate of transistor 674. Since the swing in the current is enhanced, a larger swing is seen at node 678 where the gain is equal to Gm of transistor 674 times the value of gain resistor Rgain 676. Accordingly, if the gate of transistor 674 receives a gain of V1 (from node 668), then node 678 or SAIN 680 would be equal to V1 multiplied by the transconductance (Gm) of transistor 674 times the value of the gain resistor Rgain 676. The circuit 600 effectively takes CASFB as high as possible and allows SAIN to swing from about 0 to about Vcc for the range of the currents that need to be sensed. This allows for a greater discrimination among bit levels since, among other things, keeping CASFB as high as possible mitigates the effect of the complimentary bit that is not being read.

It will be appreciated that the circuit 600 also mitigates noise on the supply voltage Vcc 616. For example, in the bitline path 626, if Vcc is shifted by x millivolts, then this same shift is seen at node 656 since the voltage at this node is equal to Vcc minus the core current 612 times Rsense 654 (effect of the PD 634 being negligible). This shift is similarly seen at node 668 as the level shifter component 628 would merely (linearly) shift the x millivolt noise up or down. As such, the x millivolt noise would appear at the gate of the gain transistor 674. The same x millivolt noise would also, however, appear at the source of the gain transistor 674 since Rsd 672 (like Rsense 654) will not affect the noise (and the effect of PD 638—as with PD 634—can be ignored). The same noise on the gate and source of transistor 674 cancel each other out. More particularly, since merely Rgain 676 and the Gm of device 674 contribute to the gain of stage 630, and Rgain is a constant and the Gm of transistor 674 is decided by its gate voltage (Vg) minus its source voltage (Vs)—both of which possess the same x millivolt noise—this noise will be cancelled out. As such, the Gm of transistor 674 stays the same in the presence of noise from the supply voltage 616, and thus so does the gain of stage 630. Similarly, Vcc noise at the differential amplifier 622 can generally be ignored as the differential amplifier is effectively able to reject such noise. Likewise, resistor Rsd 672 can shift the voltage at the source of transistor 674 in a direction opposite to the direction of noise introduced through to the circuit.

Figure 7:
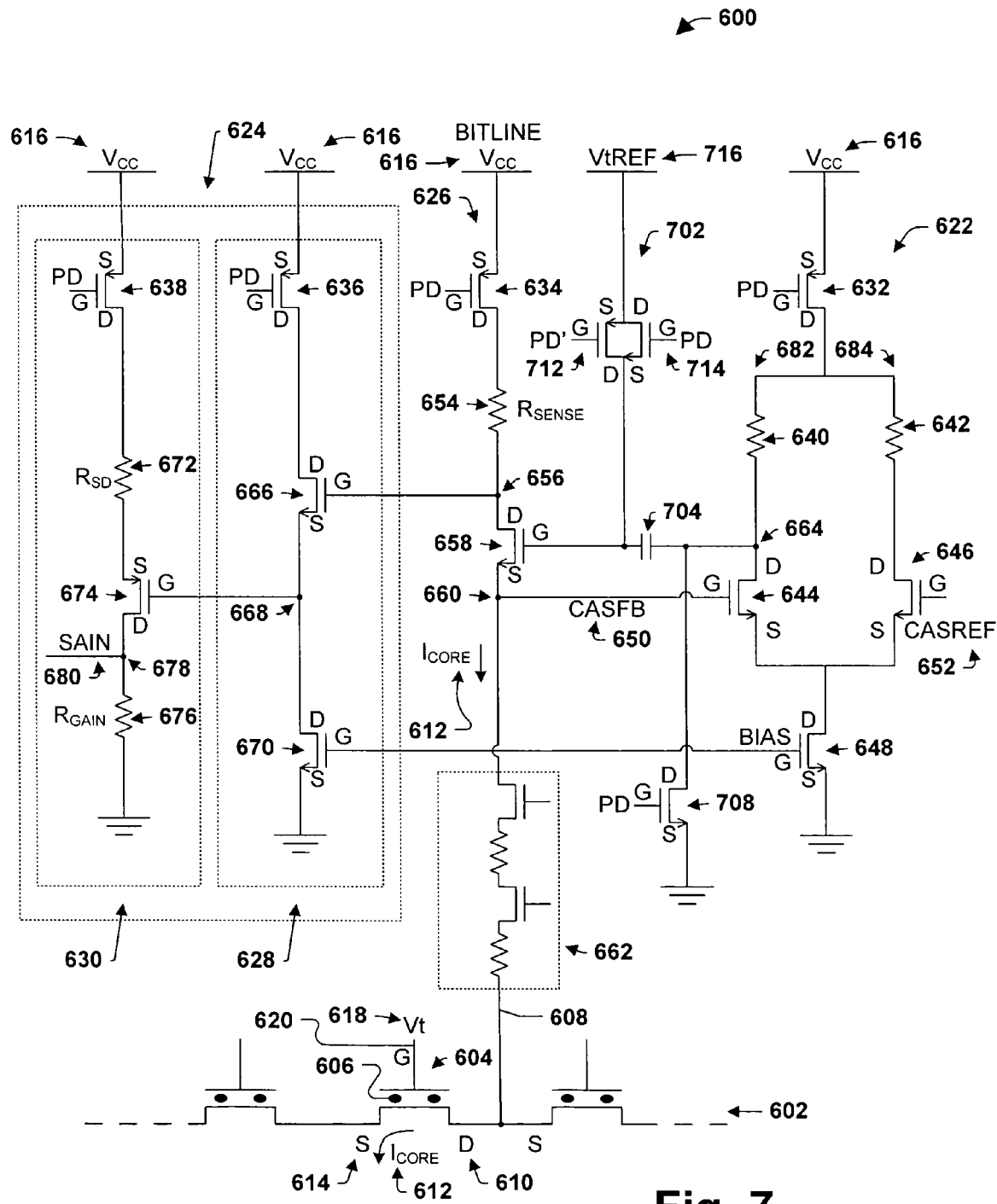
FIG. 7 is a schematic diagram illustrating an exemplary current sensing circuit according to one or more aspects of the presenting invention that includes a bootstrapping component.

FIG. 7 illustrates another exemplary circuit arrangement similar to that presented in FIG. 6, but including a bootstrap component 702. Many of the components, elements, parts, etc. illustrated in FIG. 7 are similar to those in FIG. 6 and thus are addressed with the same reference characters. These similar components, elements, parts, etc. are not discussed again in FIG. 7 for purposes of brevity.

The bootstrap component 702 is operatively coupled between the differential amplifier component 622 and the bitline path 626. In particular, a bootstrapping capacitor 704 of the bootstrap component 702 is coupled at a first or left end to the gate (G) of the bitline transistor 658, and to node 664 of differential amplifier component 622 at a second or right end. Further, the second end of bootstrapping capacitor 704 is also coupled to the drain (D) of an NMOS transistor 708, the source (S) of which is coupled to ground and the gate (G) of which is coupled to a power down (PD) signal input. Similarly, the first end of the bootstrapping capacitor 704 is further coupled to the drain (D) of a first PMOS initializing transistor 712 as well as to the source (S) of a second NMOS initializing transistor 714. The source (S) of the first initializing transistor 712 and the drain (D) of the second initializing transistor 714 are coupled to one another as well as to a reference voltage VtREF 716. The gate (G) of the first initializing transistor 712 is coupled to an inverse power down (PD') signal input while the gate (G) of the second initializing transistor 714 is coupled to a regular power down (PD) signal input.

It can be appreciated that when a power down signal is applied to the circuit, the gate of NMOS transistor 708 is driven so that that transistor turns on and acts as a short drawing the second end of the bootstrapping capacitor 704 to ground. Similarly, such a power down signal causes transistor 714 to short so that the left side of capacitor 704 is charged to VtREF, where the voltage value VtREF is set to the threshold voltage Vt of transistor 658 (or some value close thereto). Likewise, the PMOS device 712 similarly turns on to short VtREF to the gate of transistor 658 in response to a PD signal since the gate of the PMOS device 712 is coupled to an inverse PD signal input. Basically, both devices 712, 714 (which initialize the capacitor when the circuit is powered down) are either on or off as they act as a complimentary MOS (CMOS) pass gate. This allows the gate of transistor 658 to be overdriven by a value of Vcc plus VtREF.

More particularly, the gate of transistor 658 is over driven because after the circuit comes out of a powered-down state, the voltage on node 664 increases as the differential amplifier component 622 attempts to regulate the bitline voltage level to CASREF. However, no current path exists to alter the charge stored in the bootstrapping capacitor 704. Therefore, by conservation of charge principle, the voltage across the bootstrapping capacitor 704 must stay the same. Thus, the gate (G) of NMOS 658 is bootstrapped (moves in the same direction) as the other end of bootstrapping capacitor (node 664). This implies that the voltage on gate (G) of NMOS 658 equals VtREF plus the voltage on node 664. It is evident that the voltage on node 664 can go as high as Vcc when attempting to regulate the bitline voltage to its highest limit. At that point of operation, the voltage on gate (G) of NMOS 658 is bootstrapped to VtREF plus Vcc. Overdriving transistor 658 in this manner mitigates a drop of approximately Vt that would otherwise be seen across transistor 658 (e.g., from its drain to its source). Compensating for the Vt of transistor 658 allows the drain of the memory cell 604 being read to see a voltage that is higher by the amount VtREF 716 by increasing the bitline voltage by this amount.

Figure 8:
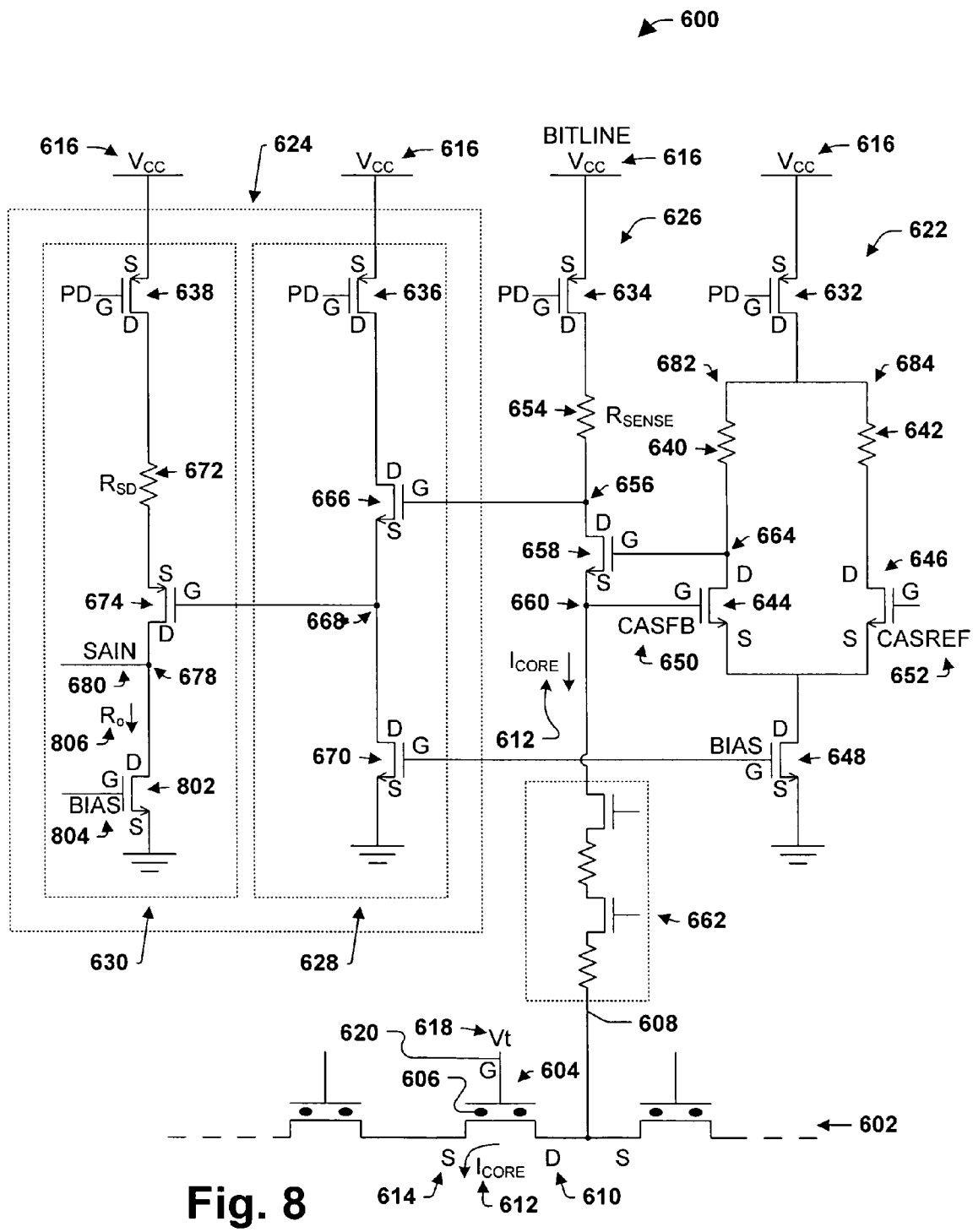
FIG. 8 is a schematic diagram illustrating an exemplary current sensing circuit according to one or more aspects of the presenting invention that has a tunable or controllable gain.

FIG. 8 illustrates yet another exemplary circuit arrangement similar to that presented in FIG. 6, but where the gain resistor Rgain 676 is replaced with a tunable NMOS transistor 802. As with FIG. 7, components, elements, parts, etc. in FIG. 8 that are similar to those illustrated in FIG. 6 are addressed with the same reference characters, but are not discussed again for purposes of brevity. The transistor 802 is oriented so that its drain (D) is coupled to the drain (D) of gain transistor 674 as well as to node 678. The source (S) of transistor 802 is coupled to ground while its gate (G) is coupled to a bias source 804.

Similar to the arrangements depicted in FIGS. 6 and 7, the gain at SAIN in FIG. 8 is equal to the transconductance (Gm) of transistor 674 times the resistance across the element going from node 678 to ground. In FIG. 8, this resistance is designated as Ro 806, which is the resistance seen looking into the drain of transistor 802. Accordingly, the gain is equal to Gm×Ro. However, since transistor 802 is an active element or an active load, its resistance can be tuned by adjusting the bias 804 applied to its gate. As such, the gain of the circuit can be controlled by merely adjusting the bias voltage applied to the gate of transistor 802. It will be appreciated that the tunable feature of FIG. 8 and the overcharging aspect of FIG. 7 are not exclusive of one another, but can be combined so as to be included within the same circuit.

Figure 9:
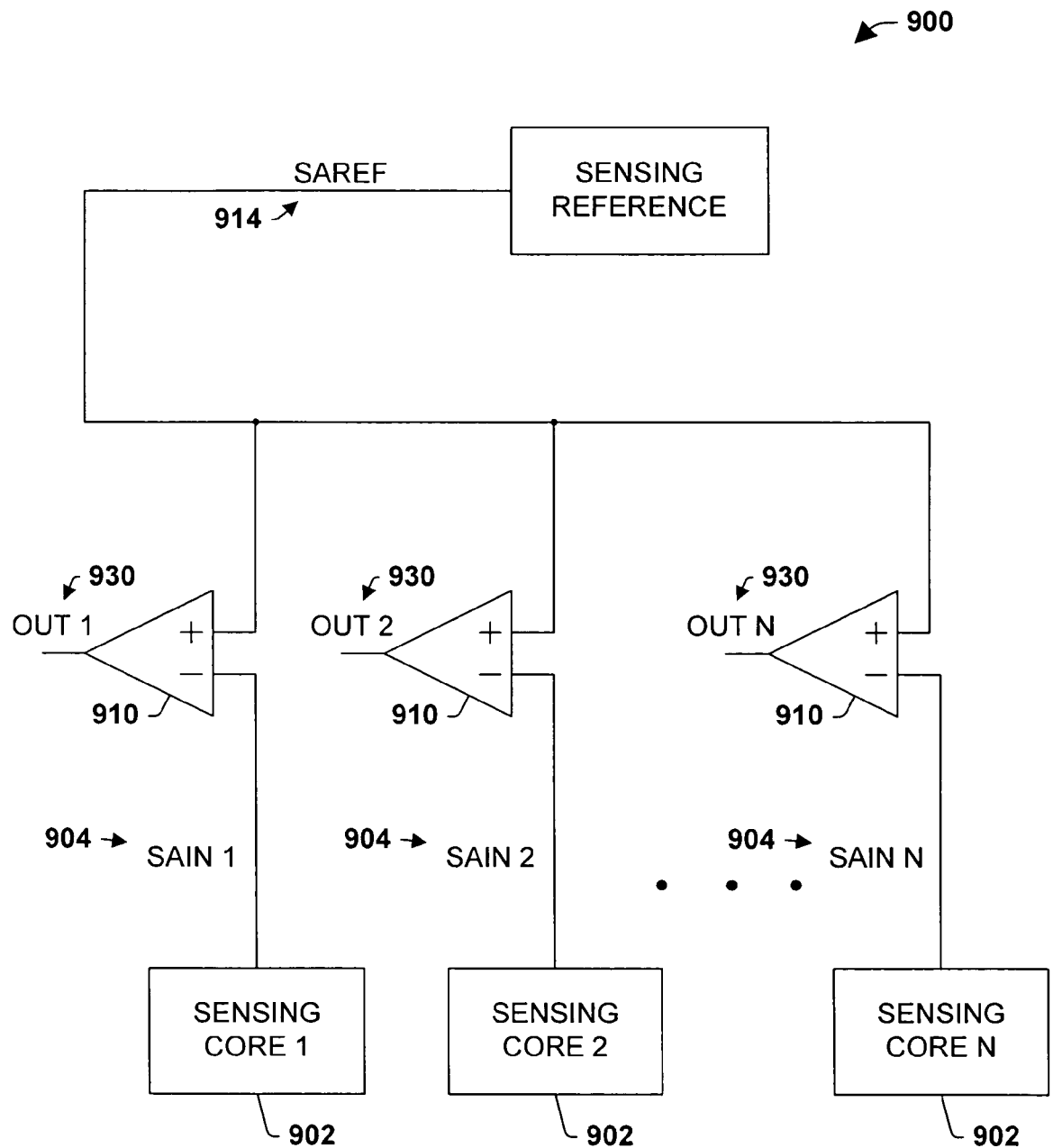
FIG. 9 is a high level block diagram illustrating application of a circuit according to one or more aspects of the present invention.

Turning to FIG. 9, a block diagram 900 illustrates application of one or more aspects of the present invention at a high level. In particular, n number of sensing core blocks 902 are shown (n being a positive integer) where the respective core blocks may correspond to core memory cells from which current is being sensed during a read operation to determine the status or level of data stored within the cells. As such, a corresponding n number of SAIN signals 904 are seen emanating from the blocks 902, where such signals may be generated from respective current sensing circuits such as those depicted in FIGS. 7, 8 and 9 that produce SAIN 680 as an output.

N number of operational amplifiers 910 are included to receive corresponding SAIN signals 904 at their negative input terminals in the illustrated example. The operational amplifiers 910 function as comparators and receive reference values SAREF 914 at their positive input terminals. The reference values 914 are generated from a sensing reference block 922 that may correspond to a current sensing circuit such as that depicted in FIGS. 7, 8 and 9, but where the circuit is connected to a reference cell—the level of which is known—rather than to a core memory cell whose level or state is yet to be determined. As such, the operational amplifiers 910 compare the SAIN values to the SAREF reference values and output respective signals 930 that are indicative of the level of the core memory cell being read.

However, since the SAREF line can be long and loaded n number of times (e.g., with operational amplifiers 910 and core blocks 902) the capacitance on that line can becomes large. One or more aspects of the present invention compensate for this by increasing the current on the SAREF (instead of by increasing the capacitance on the SAIN node), which speeds up the operation. Conventionally this could not be done because the current at the output stage was the same as the current going through the core cell. The more current capability available at the output stage, the faster SAREF can be brought to a desired level. Since the output is derived from a separate current branch according to one or more aspects of the present invention, the output current is not dependent on the memory cell current (as was the case in conventional arrangements). The output current can thus be designed to any value, where increasing the output current results in a substantially faster circuit operation (because a larger current at the output can charge up the output load capacitance much faster). Essentially, the reference line benefits from an increase in output current which results in a faster speed.

Further, a higher bitline voltage according to one or more aspects of the present invention is advantageous because during a read operation a reference current (e.g., from a memory cell whose Vt the core Vt is being compared) is compared to a core current (e.g., from a memory cell being sensed) in order to determine bit levels. The currents are measured at predefined gate (wordline) and bitline voltage levels. The wordline level is kept high enough so that the current levels are easily observable and low enough to reduce power consumption. The bitline levels are kept high enough so that the memory cells are as close to their saturation region of operation as possible. This is desirable because in the saturation region, the device (memory cell) current is proportional to the Square of Vgs-Vt (determined by wordline voltage) and independent of Vds (determined by bitline voltage). Therefore, when a device is operating in its saturation region, the device transconductance is much higher and results in a larger Ids differential for a given Vt differential between reference and core memory cells. If the bitline level is lower, the memory cell operates closer to the linear region of operation. In linear region of operation, the device current is proportional to both (Vgs-Vt) and Vds. Therefore, for a given Vt differential between core and reference memory cells, the Ids differential is linear and lower than the saturation case. Further, when the device is in the linear region, the current is also dependent on Vds (bitline level). As the current increases, the bitline level drops due to the parasitics in the bitline path, which results in a read-margin loss if the device is operating in its linear region. Accordingly, it is advantageous to sense the memory cells while they operate in the saturation region of operation. Raising the bitline level (and thus Vds) pushes the cells closer to saturation region of operation and thus improves read margin.

It will be appreciated that the gain transistor 674 referenced herein could comprise an n type or NMOS transistor instead of a PMOS transistor. An NMOS transistor may obviate the need for level shifting, but may not, however, provide for supply voltage Vcc 616 noise cancellation. It will also be appreciated that, while the discussion herein has generally been directed to memory, and in particular to flash memory, that one or more aspects of the present invention can be used in any application where current sensing/comparison is desired and/or necessary, and should not, therefore, be limited to flash memory applications, nor to virtual ground architectures.

Although the invention has been shown and described with respect to one or more implementations, equivalent alterations and modifications will occur to others skilled in the art based upon a reading and understanding of this specification and the annexed drawings. The invention includes all such modifications and alterations. With regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means an example, rather than the best.

What is claimed is:

1. A circuit for sensing a core current flowing through a bitline path and a memory cell in response to voltages applied to a gate of the cell and an acting drain of the cell, the magnitude of the core current also being a function of the amount of charge stored within the cell, the circuit comprising:

a differential amplifier component operatively coupled to the bitline path and configured to provide a substantially constant desired voltage to a desired voltage node on the bitline path where the bitline path is operatively coupled to the acting drain of the cell; and a post processing circuit component operatively coupled to the bitline path and configured to receive an Rsense voltage that is a function of the core current and further configured to output an output voltage (SAIN) that is indicative of the core current, but is an amplification of the Rsense voltage, the post processing circuit component comprising:

a level shifter component operatively coupled to the bitline path and configured to shift the Rsense voltage; and a common source gain component operatively coupled to the level shifter component and configured to receive the shifted Rsense voltage and to amplify the same to produce the output voltage.

2. A circuit for sensing a core current flowing through a bitline path and a memory cell in response to voltages applied to a gate of the cell and an acting drain of the cell, the magnitude of the core current also being a function of the amount of charge stored within the cell, the circuit comprising:
a differential amplifier component operatively coupled to the bitline path and configured to provide a substantially constant desired voltage to a desired voltage node on the bitline path where the bitline path is operatively coupled to the acting drain of the cell; and
a post processing circuit component operatively coupled to the bitline path and configured to receive an Rsense voltage that is a function of the core current and further configured to output an output voltage (SAIN) that is indicative of the core current, but is an amplification of the Rsense voltage, the post processing circuit comprising:
a level shifter component operatively coupled to the bitline path and configured to shift the Rsense voltage; and
a common source gain component operatively coupled to the level shifter component and configured to receive the shifted Rsense voltage and to amplify the same to produce the output voltage,
wherein the level shifter component comprises a source follower transistor that level shifts the Rsense voltage.

3. The circuit of claim 2, wherein a gate of the source follower transistor receives the Rsense voltage.

4. The circuit of claim 2, wherein a source of the source follower transistor outputs the shifted Rsense voltage.

5. The circuit of claim 2, wherein the source follower transistor is an NMOS transistor.

6. The circuit of claim 2, wherein the common source gain component comprises a gain transistor and a gain resistor Rgain, where the amplification of the common source gain component is equal to the transconductance (Gm) of the gain transistor multiplied by the value of the gain resistor, and where the output voltage of the common source gain component can be taken at a drain of the gain transistor.

7. The circuit of claim 2, wherein the common source gain component comprises a gain transistor and a tunable transistor, where the amplification of the common source gain component is equal to the transconductance (Gm) of the gain transistor multiplied by a resistance value (Ro) of the tunable transistor as seen looking into a drain of the tunable transistor, where Ro can be adjusted by controlling a bias voltage applied to a gate of the tunable transistor, and where the output voltage of the common source gain component can be taken at a drain of the gain transistor.

8. The circuit of claim 6, wherein at least one of:
a gate of the gain transistor receives the shifted Rsense voltage;
the gain transistor comprises a PMOS transistor;
the gain resistor has a value of between about 15000 ohms to about 30000 ohms;
the output voltage (SAIN) from the post processing circuit component can swing from between about 0 volts to about a supply voltage (Vcc); and
available current in output node (SAIN) from the post processing circuit component can be much larger than the memory cell current—thus resulting in a faster output settling down speed.

9. The circuit of claim 8, wherein a sense resistor Rsense is included in the bitline path for developing the Rsense voltage.

10. The circuit of claim 9, wherein at least one of:
the sense resistor has a value of between about 3000 ohms to about 5000 ohms; and
the Rsense voltage is between about 50 millivolts to about 150 millivolts.

11. The circuit of claim 9, wherein the differential amplifier component is operatively coupled to the bitline path via a bitline transistor within the bitline path.

12. The circuit of claim 11, wherein at least one of:
the bitline transistor is an NMOS transistor; and
a gate of the bitline transistor is operatively coupled to the differential amplifier, a drain of the bitline transistor is coupled to the sense resistor Rsense so as to receive the Rsense voltage and a source of the bitline transistor is coupled to the desired voltage node.

13. The circuit of claim 12, wherein the differential amplifier component comprises:
a left branch; and
a right branch,
where the left and right branches are in parallel with one another,
where the left branch includes a left resistor and a left transistor in series with one another,
where the right branch includes a right resistor and a right transistor in series with one another,
where the gate of the bitline transistor is coupled to the left branch of the differential amplifier between the left resistor and the left transistor,
where a gate of the left transistor is coupled to the desired voltage node,
where a gate of the right transistor is coupled to reference voltage about which the differential amplifier component modulates the desired voltage at the desired voltage node, and
where a source of the left transistor and a source of the right transistor are coupled to a drain of a bias transistor, a source of which is coupled to ground.

14. The circuit of claim 13, wherein the level shifter component further comprises:
a secondary transistor, a gate of which is coupled to a gate of the bias transistor, a source of which is coupled to ground and a drain of which is coupled to a source of the source follower transistor so as to receive the shifted Rsense voltage.

15. The circuit of claim 14, wherein the common source gain component further comprises:
a source degeneration resistor operatively coupled to a source of the gain transistor and designed to mitigate noise introduced to the circuit through a source of power.

16. The circuit of claim 15, wherein the differential amplifier component, sense resistor in the bitline path, level shifter component and common source gain component are coupled to at least one of a supply voltage Vcc and respective power down (PD) transistors.

17. The circuit of claim 13, further comprising:
a bootstrapping component situated between the differential amplifier and the bitline path and operable to compensate for a threshold voltage drop across the bitline transistor, the bootstrapping component comprising:
a bootstrapping capacitor, a left end of which is coupled to the gate of the bitline transistor, and a right end of which is coupled to the left branch of the differential amplifier between the left resistor and the left transistor, where the right end of the bootstrapping capacitor is coupled to ground and the left end of the bootstrapping capacitor is coupled to a reference voltage VtREF when a power down (PD) signal is applied to the circuit, where VtREF is at or close to a threshold voltage value of the bitline transistor.

18. The circuit of claim 17, wherein the bootstrapping component further comprises:
- an NMOS transistor, a drain of which is coupled to the right end of the bootstrapping capacitor, a source of which is coupled to ground and a gate of which is coupled to a power down (PD) signal input such that the right end of the bootstrapping capacitor is coupled to ground upon application of a power down (PD) signal; and
- a CMOS pass gate coupled to the left end of the bootstrapping capacitor and the VtREF voltage, and configured to couple the gate of the bitline transistor to VtREF upon application of a (PD) signal.

19. The circuit of claim 18, wherein the CMOS pass gate comprises:
- a PMOS initializing transistor, a drain of which is coupled to the left end of the bootstrapping capacitor, a source of which is coupled to VtREF and a gate of which is coupled to an inverse power down signal input; and
- an NMOS initializing transistor, a drain of which is coupled to VtREF and the source of the PMOS initializing transistor, a source of which is coupled to the left end of the bootstrapping capacitor and the drain of the PMOS initializing transistor and a gate of which is coupled to a power down signal input.

20. The circuit of claim 18, where after the circuit comes out of a power down state, the bootstrapping capacitor facilitates applying a voltage of a supply voltage (Vcc) plus VtREF onto the desired voltage node.

21. The circuit of claim 16, where noise from the supply voltage Vcc is cancelled by being applied substantially equally to the gate (G) of the gain transistor of the common source gain component and the source (S) of the gain transistor of the common source gain component.

22. A circuit for sensing a core current flowing through a bitline path and a multi-level memory cell in response to voltages applied to a gate of the cell and an acting drain of the cell, the magnitude of the core current also being a function of the amount of charge stored within the cell, the circuit comprising:
- a post processing circuit component operatively coupled to the bitline path and configured to receive a level shifted Rsense voltage that is a function of the core current and further configured to output an output voltage (SAIN) that is indicative of the core current, but is an amplification of the Rsense voltage, the Rsense voltage being generated in the bitline path, and the multi-level cell configured to store three or more states such that the output voltage (SAIN) is indicative of one of the three or more possible states of the multi-level memory cell.

* * * * *